US008507108B2

(12) United States Patent
Larsson et al.

(10) Patent No.: US 8,507,108 B2
(45) Date of Patent: Aug. 13, 2013

(54) THIN WEAR RESISTANT COATING

(76) Inventors: Tommy Larsson, Angelsberg (SE);
Lennart Karlsson, Fagersta (SE)

(*) Notice: Subject to any disclaimer, the term of this patent is extended or adjusted under 35 U.S.C. 154(b) by 993 days.

(21) Appl. No.: 11/429,450

(22) Filed: May 8, 2006

(65) Prior Publication Data

US 2007/0178330 A1 Aug. 2, 2007

(51) Int. Cl.
*B32B 9/00* (2006.01)

(52) U.S. Cl.
USPC ............... 428/697; 51/307; 51/309; 428/698; 428/699; 428/704

(58) Field of Classification Search
USPC .................. 51/307, 309; 428/697, 698, 699, 428/704
See application file for complete search history.

(56) References Cited

U.S. PATENT DOCUMENTS

| | | | | |
|---|---|---|---|---|
| 5,700,551 A | * | 12/1997 | Kukino et al. | 51/309 |
| 5,882,778 A | * | 3/1999 | Sugizaki et al. | 428/704 |
| 6,586,122 B2 | * | 7/2003 | Ishikawa et al. | 51/309 |
| 6,767,658 B2 | * | 7/2004 | Yamamoto et al. | 428/697 |
| 6,824,601 B2 | * | 11/2004 | Yamamoto et al. | 428/699 |
| 6,887,562 B2 | * | 5/2005 | Hugosson | 428/697 |
| 7,056,602 B2 | * | 6/2006 | Horling et al. | 51/307 |
| 7,067,203 B2 | * | 6/2006 | Joelsson et al. | 428/699 |
| 7,083,868 B2 | * | 8/2006 | Horling et al. | 428/698 |
| 7,226,670 B2 | * | 6/2007 | Derflinger et al. | 428/697 |

FOREIGN PATENT DOCUMENTS

| | | | |
|---|---|---|---|
| DE | 10242421 | * | 3/2004 |
| EP | 1174528 | | 1/2002 |
| EP | 1219723 | | 7/2002 |
| EP | 1378304 | | 1/2004 |
| JP | 2004 128363 | | 4/1992 |
| JP | 11-302831 | * | 11/1999 |
| JP | 2000-144376 | * | 5/2000 |

OTHER PUBLICATIONS

Grimberg et al "mulitcomponent Ti-Zr-N And Ti-Nb-N coating deposited by vacuum arc". suface and coating technology 108-109 (1998) p. 154-159.*
Boxman et al "Structure and hardness of vacuum arc deposited multicomponent nitride coatings of Ti,Zr and Nb" . surface and coating technology 125 (2000) p. 257-262.*
Debessai et al "Niobium zirconium nitride sputter-deposited protective coatings" Applied Surface Science 236 (2004) p. 63-70.*

(Continued)

*Primary Examiner* — Archene Turner
(74) *Attorney, Agent, or Firm* — WRB-IP LLP; David J Serbin

(57) ABSTRACT

The present invention relates to a cutting tool insert, solid end mill, or drill, comprising a substrate and a coating. The coating is composed of one or more layers of refractory compounds of which at least one layer comprises a h-Me1Me2X phase, where Me1 is one or several of the elements V, Cr, Nb, and Ta and Me2 is one or several of the elements Ti, Zr, Hf, Al, and Si and X is one or several of the elements N, C, O or B. The ratio R=(at-% X)/(at-% Me1+at-% Me2) of the h-Me1Me2X phase is between 0.5 and 1.0, preferably between 0.8 and 1.0 and X contains less than 30 at-% of O+B. This invention is particularly useful in metal cutting applications where the chip thickness is small and the work material is hard e.g. copy milling using solid end mills, insert milling cutters or drilling of hardened steels.

15 Claims, 2 Drawing Sheets

(56) References Cited

OTHER PUBLICATIONS

European Search Report, completed Aug. 8, 2006.
Roos et al, Interrelationship Between Processing, Coating Properties and Functional . . . , Journal of the Less-Common Metals, vol. 193, No. 1/2, Dec. 1, 1990, pp. 547-556.
Kutschej et al, Comparative Study of Ti1-xA1xN coatings alloyed with . . . , Surface and Coatings Technology, Elsevier, Amsterdam, NL, vol. 200, No. 1-4, Mar. 19, 2005, pp. 113-117.
Knotek et al, The Structure . . . , Materials Science & Engineering A: Structural Materials: Properties, Microstructure & Processing, Lausanne, CH, vol. A105/106, 1/98, pp. 481-488.

* cited by examiner

THIN WEAR RESISTANT COATING

FIELD OF THE INVENTION

The present invention relates to cutting tools. More specifically, the invention relates to a coated cutting tool and a method for its manufacture, wherein the coating provides enhanced performance and has a unique crystalline structure.

SUMMARY AND BACKGROUND OF THE INVENTION

The present invention relates to a cutting tool for machining by chip removal consisting of a substrate of cemented carbide, cermet, ceramics, cubic boron nitride based material, or high speed steel, and a hard and wear resistant refractory coating of which at least one layer comprises a hexagonal MeX-phase formed in-situ during the deposition either as a single phase or by co-deposition together with a second phase. This finding can be used in several ways giving a high degree of possibilities to tailoring the properties of the finished tool, for example, as hexagonal structure particles in a coating matrix of another type, or of the same type, of crystal structure, or as separate layers within a multilayer superstructure. Since the hexagonal type of structure has different mechanical and chemical properties than for instance a cubic structure, the combination of different types of crystallites can give completely new properties compared to a single structure material.

The majority of all PVD-layers used today for metal cutting for machining by chip removal consists of crystalline TiN, Ti(C,N), and (Ti,Al)N with a cubic NaCl type structure. However, a metastable (Ti,Al)N layer will at elevated temperature, during heat treatment or at service if sufficient amount of energy is supplied, phase separate into c-TiN and h-AlN. These precipitates of a h-AlN and/or c-AlN can act as hardeners in the layers. It has been demonstrated that an optimised amount of precipitates of c-AlN and/or h-AlN in a cubic c-(Ti,Al)N matrix will improve the performance of the layer as disclosed by EP-A-1400609 and EP-A-1452621. However, the volume occupied per atom in the hexagonal (wurtzite type) structure is 25% larger than in the cubic structure (NaCl type). Therefore, if the degree of structural transformation of an applied (Ti,Al)N layer proceeds too far this may lead to cohesive failure and accelerated wear of the layer.

It is an object of the present invention to provide a coating comprising at least one layer containing a h-MeX phase to be applied to a cutting tool for machining by chip removal.

It is a further object of the present invention to provide a method for depositing layers comprising an h-MeX phase using PVD technology.

It has been found that, by balancing the chemical composition, the amount of thermal energy and the degree of ion induced surface activation during growth, growth rate, and pressure, layers containing h-MeX phase can be obtained which, compared to the prior art, display enhanced performance in metal cutting. The layers comprise crystals of h-MeX with or without the co-existence of c-NaCl type structures of nitrides and/or carbides and/or oxides. The layers are deposited using PVD-technique, preferably by arc evaporation.

DETAILED DESCRIPTION OF THE INVENTION

Figure 1:
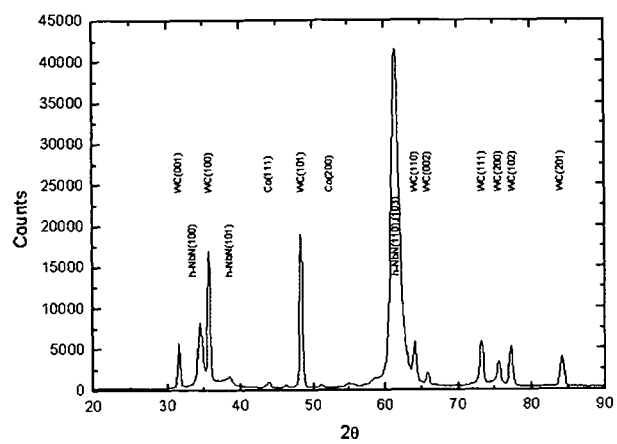
FIG. 1 is an X-ray diffraction pattern using CuKα radiation and θ-2θ geometry obtained from a h-NbN-layer, according to the invention, in the as-deposited condition.

According to the present invention, a cutting tool for machining by chip removal is provided comprising a body of a hard alloy of cemented carbide, cermet, ceramics, cubic boron nitride based material, or high speed steel, onto which a wear resistant coating is deposited composed of one or more layers of refractory compounds, at least one layer being composed of crystals of h-MeX phase. Additional layers are composed of nitrides and/or carbides and/or oxides with the elements chosen from Ti, Zr, Hf, V, Nb, Ta, Cr, Mo, W, Si and Al, grown using physical vapour deposition (PVD), or other deposition technologies such as plasma enhanced chemical vapour deposition (PACVD) and/or chemical vapour deposition (CVD). Tools according to the present invention are particularly useful in metal cutting applications where the chip thickness is small and the work material is hard such as copy milling using solid end mills, insert milling cutters or drilling of hardened steels.

The h-MeX layer(s) comprise crystals of h-MeX phase. The composition shall be described as $Me1_aMe2_{1-a}X_b$ where Me1 is one or several of the elements V, Cr, Nb, and Ta and Me2 is one or several of the elements Ti, Zr, Hf, Al, and Si and a>0.5 and X one or several of the elements N, C, O and B. The non-metal to metal atomic ratio, here defined as R=(at-% X)/(at-% Me1+at-% Me2) of the h-(Me1,Me2)X phase, is between 0.5 and 1.0, preferably between 0.75 and 1.0.

The h-MeX layer comprising h-(Me1,Me2)X phase is characterised by:

The existence of a crystalline hexagonal phase, h-(Me1,Me2)X, as detected by X-ray diffraction (XRD) in θ-2θ and/or gracing incidence geometry showing one or several of the following features:

- a h-(Me1,Me2)X (100) peak, in case of h-NbN using CuKα radiation at approximately 35° 2θ,
- a h-(Me1,Me2)X (101) peak, in case of h-NbN using CuKα radiation at approximately 39° 2θ,
- a h-(Me1,Me2)X (102) peak, in case of h-NbN using CuKα radiation at approximately 48° 2θ,
- a h-(Me1,Me2)X (110) peak, in the case of h-NbN using CuKα radiation at approximately 62° 2θ,
- a h-(Me1,Me2)X (103) peak, in the case of h-NbN using CuKα radiation at approximately 62° 2θ,
- a h-(Me1,Me2)X (112) peak, in case of h-NbN using CuKα radiation at approximately 72° 2θ,
- a h-(Me1,Me2)X (201) peak, in case of h-NbN using CuKα radiation at approximately 75° 2θ,
- a h-(Me1,Me2)X (202) peak, in the case of h-NbN using CuKα radiation at approximately 83° 2θ,
- When Me and X are not Nb and N, respectively, the peak positions could be shifted.

The structure of the h-(Me1,Me2)X is preferably of anti-NiAs type.

The texture defined as the ratio, K, between the area of the h-(Me1,Me2)X (100) peak, using CuKα radiation in θ-2θ geometry, and the h-(Me1,Me2)X (110) plus (103) peaks is between 0 and 0.5 and preferably between 0.0 and 0.25.

The ratio, L, between the area of the h-(Me1,Me2)X (110) plus (103) peaks (=A(h-(Me1,Me2)X110+103) and the c-(Me1,Me2)X (200) peak (=A(c-(Me1,Me2)X200), i.e. L=A(h-Me1Me2X110+103)/A(c-MeX200) in the X-ray diffraction pattern, in θ-2θ geometry, from said layer, is larger than 0.1, preferably larger than 0.2, and/or that the peak-to-background ratio for the h-(Me1,Me2)X (110) plus (103) peaks is larger than 2, preferably larger than 4.

The FWHM (Full Width Half Maximum) value, using CuKα radiation in θ-2θ geometry, caused by small grains and/or inhomogeneous stresses, of the:
h-(Me1,Me2)X (110) plus (103) peaks is between 0.5 and 3.0° 2θ and/or
h-(Me1,Me2)X (100) peak is between 0.4 and 2.5° 2θ, X consists of less than 30 at-% O and/or B with balance of N and/or C.

The layer comprising h-(Me1,Me2)X has a considerably increased hardness compared to a cubic single phase layer of a NaCl type c-MeX structure, see Example 1, as demonstrated by the system of h-(Nb,Zr)N and c-(Nb,Zr)N.

The total coating thickness, if the h-(Me1,Me2)X containing layer(s) according to the present invention are combined with other layer(s), is between 0.1 and 15 μm, preferably between 0.5 and 12 μm with the total thickness of the non h-(Me1,Me2)X containing layer(s) varying between 0.5 and 10 μm.

In an alternative embodiment the h-(Me1,Me2)X containing layer(s) of 0.5 and 12 μm thickness, with or without other layer(s) according to the above described, an outer 0.5 to 5 μm thick layer consisting of a solid low friction material based on $MoS_2$, DLC (Diamond Like Coating) or a MeC/C, where Me is Cr, W, Ti or Ta, can be deposited on top of the coating.

In yet another alternative embodiment the h-(Me1,Me2)X containing layer(s), between 0.1 and 2 μm thickness, are one of one to five different materials in a 1.0 to 15 μm thick multilayer coating consisting of individually 2-500, preferably 5-200, layers.

In yet another alternative embodiment the h-(Me1,Me2)X containing layer(s) of 0.5 and 20 μm thickness can be deposited on top of a CVD coating which may comprise one or several layer(s) of crystalline $Al_2O_3$.

In yet another alternative embodiment at least one h-(Me1,Me2)X containing layer(s) of 0.1 and 1.0 μm thickness is used for metal cutting application where the chip thickness is very small.

The method used to grow the layers, comprising h-(Me1,Me2)X phase of the present invention, here exemplified by the system Nb—Zr—N, is based on arc evaporation of an alloyed, or composite cathode, under the following conditions:

The Nb—Zr cathode composition is >70 at-% Nb, preferably >80 at-% Nb and balance of Zr.

The evaporation current is between 50 A and 200 A depending on cathode size and cathode material. When using cathodes of 63 mm in diameter the evaporation current is preferably between 70 A and 140 A.

The substrate bias is between −10 V and −300 V, preferably between −40 V and −120 V.

The deposition temperature is between 400° C. and 700° C., preferably between 500° C. and 700° C.

If pure Nb and/or Zr cathodes are used the evaporation current is preferably between 80 A and 140 A for Nb and between 60 A and 100 A for Zr. In order to get the correct composition of the layer, working with pure single element cathodes, the arc current and the number of cathodes per element has to be optimised properly. By using twice as many Nb cathodes as Zr cathodes, and/or a higher arc current on the Nb cathodes, the correct layer composition and structure in the Nb—Zr system can be achieved.

When growing layer(s) containing h-(Me1,Me2)X an Ar+$N_2$ atmosphere consisting of 0-50 vol-% Ar, preferably 0-20 vol-%, at a total pressure of 0.5 Pa to 9.0 Pa, preferably 1.5 Pa to 5.0 Pa, is used.

For the growth of h-(Me1,Me2)X layer(s) where X includes C and O, carbon and/or oxygen containing gases have to be added to the $N_2$ and/or Ar+$N_2$ atmosphere (e.g. $C_2H_2$, $CH_4$, CO, $CO_2$, $O_2$). If X also includes B it could be added either by alloying the target with B or by adding a boron containing gas to the atmosphere.

In order to obtain one of the preferred structures according to the invention, namely, a layer containing h-(Me1,Me2)X here exemplified by h-(Nb,Zr)N, the inventors have discovered that several deposition parameters should be defined. A significant factor is the ratio between the flux of Nb from the cathode and the $N_2$ partial pressure, $P_{N2}$. While the inventors are not to be bound by a particular theory, it is believed that the deposition rate, which is directly related to the Nb-flux, is rather low in the segment of rotational angle where the majority of deposition occurs. The deposition rate should not be too high, here below about 4 μm/h in one fold rotation, with two Nb cathodes separated by 180°, or about 1.5 μm/h at three fold rotation. The deposition rates given above, which actually are average values and not the key parameter, are to be seen as rough guidelines at a deposition temperature of 530° C. When using a higher deposition rate a higher deposition temperature will also be needed. For every deposition rate there is a lower limit for the $P_{N2}$ of the process. A too low $P_{N2}$ Will give metallic Nb(N) and/or c-NbN in the layer. In the used system the best results are obtained for pressures higher than 0.5 Pa. Since one key factor is to keep the maximum deposition rate low, the minimum distance between cathode surface and substrate is important, preferably 150 mm or more. Here a distance below 130 mm seems to be too short.

The deposition of layer(s) containing h-(Me1,Me2)X phase of the type described above could also be possible using V and/or Ta as Me1 due to similarities with Nb. Using Ti, Zr, and Hf, as Me2, as alloying elements should also be valid using a maximum alloying content preferably less than 20 at-%, most preferably less than 15 at-%, of the total metal content, based on reported hardness versus composition values in Table 1 for the Nb—Zr—N system. Examples on this alloying route is h-(V,Nb,Ta)N, h-(V,Nb,Ta)$_{1-x}$(Ti,Zr,Hf)$_x$N with x preferably <0.2 and most preferably <0.15.

In order to get good high temperature oxidation resistance nitrides are preferred compared to carbonitrides and carbides. Additionally improved oxidation resistance could be achieved by alloying with one or several of the Ti, Al and Si as Me2-elements and Cr as a M1-element. These alloying elements could be present in the h-(Me1,Me2)X phase as well in a second phase, which could be of c-NaCl type.

When growing layer(s) containing h-(Me1,Me2)X phase there is a risk that the compressive residual stress becomes very high, up to the level of 3-8 GPa corresponding to a strain of 0.5% to 1.5% (of the h-MeX phase), which will influence the performance negatively in cutting applications when sharp cutting edges are used and/or when the demand on good adhesion is of utmost importance. One possibility to decrease the compressive residual stresses is to apply a post annealing process, or in-situ annealing, preferably in an atmosphere of Ar and/or $N_2$ at temperatures between 600° C. and 1100° C. for a period of 20 to 600 min.

The present invention has been described with reference to layer(s) containing h-(Me1,Me2)X phase deposited using arc evaporation. It is to be understood that h-(Me1,Me2)X phase containing layer(s) also could be produced using other PVD-technologies such as magnetron sputtering, electron beam evaporation, ion plating, or laser ablation.

EXAMPLE 1

Polished cemented carbide substrates with composition 93.5 wt-% WC-6 wt-% Co-0.5 wt-% (Ta,Nb)C were used. The WC grain size was about 1 μm and the hardness was 1630 $HV_{10}$.

Before deposition, the substrates were cleaned in ultrasonic baths using alkali solution and alcohol and subsequently placed in the PVD-system using a fixture of one-fold rotation. The shortest cathode-to-substrate distance was 160 mm. The system was evacuated to a pressure of less than $2.0 \times 10^{-3}$ Pa, after which the substrates were sputter cleaned with Ar ions. The layers were grown using arc evaporation of Nb and Zr cathodes (63 mm in diameter) mounted so a vertical metal composition gradient varied from $Nb_{0.97}Zr_{0.03}$ to $Nb_{0.29}Zr_{0.71}$ (measured by EDS). The nitrogen content (measured by EDS) of the variants containing h-AlN was between $(Nb,Zr)N_{0.77-0.92}$. This means that the ratio R=(at-% X)/(at-% Me1+at-% Me2) is between 0.77 and 0.92 where X is N and Me1 is Nb and Me2 is Zr.

The deposition was carried out in a 99.995% pure $N_2$ atmosphere at a total pressure of 3.0 Pa, using a substrate bias of −110 V for 60 minutes. The layer thickness was approximately 3.5 μm. The deposition temperature was about 530° C. Immediately after deposition the chamber was vented with dry $N_2$.

The NbN layer was grown using a separate deposition experiment, using the same deposition data as above except that only pure elemental Nb cathodes were used.

Figure 2:
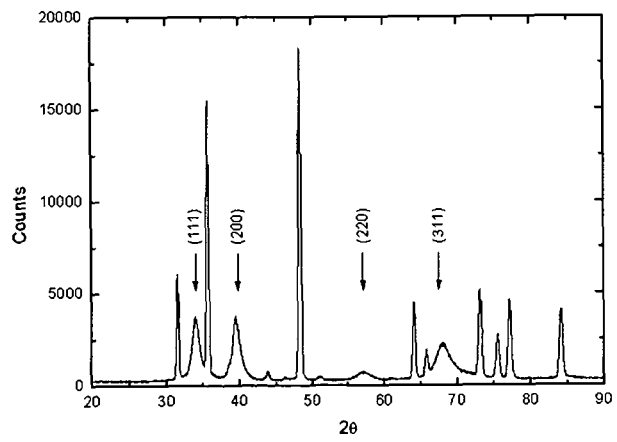
FIG. 2 is an X-ray diffraction pattern using CuKα radiation and θ-2θ geometry obtained from a (Nb,Zr)N-layer with atomic ratio of Nb/Zr=29/71 in as-deposited condition.

The X-ray diffraction patterns (CuKα radiation, θ-2θ geometry) of the as-deposited NbN and $Nb_{0.29}Zr_{0.71}N$ layers are shown in FIG. 1 and FIG. 2 respectively. Apart from the peaks corresponding to the WC-Co substrates, there are few similarities between the patterns of the NbN and $Nb_{0.29}Zr_{0.71}N$ samples. The as-deposited layer of $Nb_{0.29}Zr_{0.71}N$, FIG. 2, consists of a NaCl type structure as seen by the identification of the (111), (200), (220), and (311) peaks. However, the XRD pattern of NbN is completely different. Especially, the absence of the cubic NaCl type structure and the occurrence of a large peak at 62° 2θ (FWHM=1.2° 2θ) and a peak at 38° 2θ (FWHM=1.3°θ), both of which are not seen in $Nb_{0.29}Zr_{0.71}N$. Further, there is a slight increase in intensity going from 70 to 75° 2θ in NbN, while there is a decrease in intensity in the same region for $Nb_{0.29}Zr_{0.71}N$. Also, there is a clear difference in peak position of the peak at 34.5° 2θ in $Nb_{0.29}Zr_{0.71}N$ compared to the peak at 34.0° 2θ for NbN layer. The texture, defined as the ratio (K) between the area of the h-(Me1,Me2)X (100) peak and the h-(Me1,Me2)X (110) plus (103) peaks is for the NbN sample 0.12. The FWHM of the h-NbN (110) plus (103) peaks is 1.2° 2θ and of the h-NbN (100) peak 0.7° 2θ.

Figure 3:
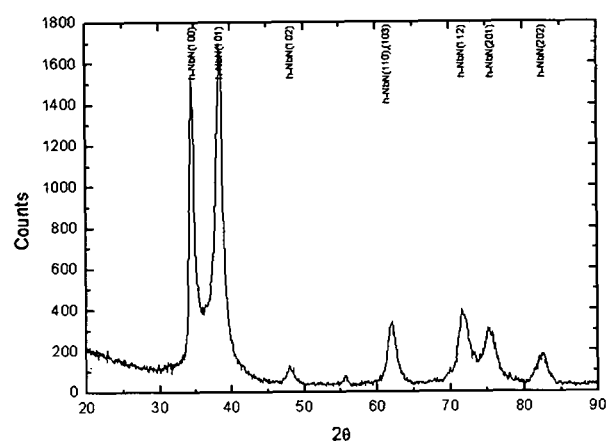
FIG. 3 is an X-ray diffraction pattern using CuKα radiation and a constant gracing incident angle of 1° between primary beam and sample surface and by scanning only the detector from a NbN-layer, according to the invention, in as-deposited condition.
Figure 4:
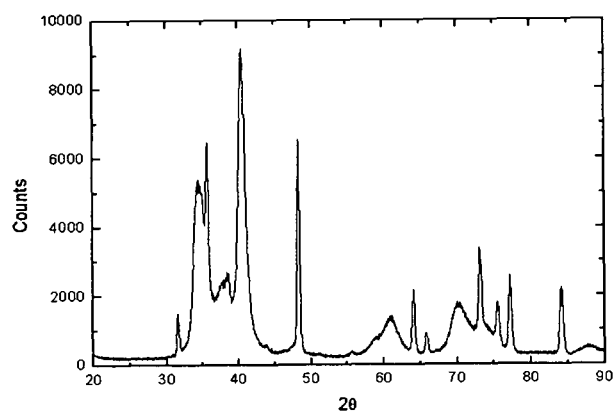
FIG. 4 is an X-ray diffraction pattern using CuKα radiation and θ-2θ geometry obtained from a (Nb,Zr)N-layer, according to the invention, with atomic ratio of Nb/Zr=86/14 in as-deposited condition.

Phase identification of the NbN in as-deposited condition was made by X-ray diffraction using a constant gracing incident angle of 1° between primary beam and sample surface and scanning the detector in order to magnify peaks originating from the coating, see FIG. 3. The presence of h-NbN is confirmed by the indexing of the diffraction pattern in the anti-NiAs type structure. At increasing Zr content the amount of c-(Nb,Zr)N (NaCl-type structure) increases. FIG. 4 shows an X-ray pattern from a layer with atomic ratio of Nb/Zr=86/14 (sample E) in as-deposited condition. The ratio, L, between the area of the h-(Me1,Me2)X (110) peak at approximately 62° 2θ (=A(h-(Me1,Me2)X)$_{110}$) and the c-(Me1,Me2)X (200) peak at approximately 41° 2θ (=A(c-(Me1,Me2)X)$_{200}$), i.e. L=A(h-(Nb,Zr)N)$_{110}$/A(c-(Nb,Zr)N)$_{200}$ is for this sample 0.25.

For selected samples found in Table 1, the peak-to-background ratio for the h-(Nb,Zr)N (110) plus (103) peaks is 153 (A), 92 (B), 109 (C), 79 (D), and 4.5 (E), respectively.

The hardness and Young's modulus of the Nb—Zr—N layers were measured by nanoindentation using a Nano Indenter™ II instrument on polished tapered cross-sections using maximum load of 25 mN resulting in a maximum penetration depth of about 200 nm. The hardness and Young's modulus values are reported in Table 1. It can clearly be seen from Table 1 that the hardness increases drastically when h-(Nb,Zr)N is present in the layer. The layer with Nb/Zr=86/14, variant E, has an hardness in-between the level of the h-(Nb,Zr)N, around 43-48 GPa, and the c-(Nb,Zr)N layers around 33 GPa.

TABLE 1

| Variant | Nb/Zr (at-%) | Hardness (GPa) | Young's Modulus (GPa) | Phases detected | FWHM h-(100) °2θ | FWHM h-(110) plus h-(103) °2θ | Res. Strain (%) | Texture parameter K |
|---|---|---|---|---|---|---|---|---|
| A | 100/0 | | | h-NbN, a = 2.98, c = 5.49 | 0.7 | 1.2 | | 0.12 |
| B | 97/3 | 47 | 595 | h-NbN, a = 3.00, c = 5.49 c-(Nb,Zr)N a = 4.44 | 0.8 | 1.5 | −1.6 | 0.12 |
| C | 95/5 | 43 | 578 | h-NbN, a = 2.98, c = 5.53 c-(Nb,Zr)N a = 4.44 | 0.8 | 1.5 | | 0.11 |
| D | 93/7 | 48 | 597 | h-NbN, a = 3.00, c = 5.49 | 0.8 | 1.6 | −1.7 | 0.19 |

TABLE 1-continued

| Variant | Nb/Zr (at-%) | Hardness (GPa) | Young's Modulus (GPa) | Phases detected | FWHM h-(100) °2θ | FWHM h-(110) plus h-(103) °2θ | Res. Strain (%) | Texture parameter K |
|---|---|---|---|---|---|---|---|---|
| E | 86/14 | 38 | 493 | c-(Nb,Zr)N a = 4.45 h-NbN, a = 3.01, c = 5.50 | 0.8 | 2.2 | | 0.52 |
| F | 75/25 | 33 | 474 | c-(Nb,Zr)N a = 4.443 c-(Nb,Zr)N a = 4.47 | | | | |
| G | 57/43 | 33 | 473 | c-(Nb,Zr)N a = 4.50 | | | | |
| H | 43/57 | 33 | 497 | c-(Nb,Zr)N a = 4.53 | | | −0.9 | |
| I | 33/67 | 33 | 491 | c-(Nb,Zr)N a = 4.55 | | | | |
| J | 29/71 | 33 | 515 | c-(Nb,Zr)N a = 4.55 | | | −0.6 | |

EXAMPLE 2

Cemented carbide exchangeable end mills of type MM12-12012-B90P-M05 with composition 90 wt-% WC-10 wt-% Co (WC grain size 0.8 μm) were coated using similar deposition conditions as in Example 1 (the name of the variants in Example 2 refers to variant names in Example 1 with similar composition). A fixture with three-fold rotation was used. The end mills were positioned at different levels in order to get different composition. The deposition period was adjusted from example 1 to 140 min in order to get 3.0 μm on the flank face. As a reference a TiN coated end mill of the same geometry and substrate was used, here called TiN. The layer thickness on the flank face on this variant was 1.4 μm.

A semi-finishing copy milling test was performed using the following cutting data:
Material: DIN X100CrMoV 5 1, 59HRC
n=4050 rpm
$a_p=a_e=0.9$ mm
$v_f=900$ mm/min
$h_m=0.015$ mm After 30 min in cut the maximum flank wear, Vbmax, was measured at two different positions (at the top and 1 mm from the top), see Table 2.

TABLE 2

| Variant | Vb max [mm] At the top | Vb max [mm] 1 mm from the top |
|---|---|---|
| C | 0.20 | 0.12 |
| E | 0.47 | 0.28 |
| I | 0.68 | 0.24 |
| TiN | 0.82 | 0.18 |

This copy milling test shows that the variant C (this invention) has the lowest wear rate followed by the variant E with a structure mixed between the h-(Nb,Zr)N and c-(Nb,Zr)N.

EXAMPLE 3

A copy milling test using RDHW10T3M0T-MD06 inserts coated similarly as in Example 1 (variants A, C and E). The tool life was measured when the inserts were worn out as defined as when sparkles were created and the material got an uneven surface. Tool life is reported in table 3.

Material: DIN X155 CrMoV 12 1, hardened to 58 HRC
Dry machining
$v_c=250$ m/min
$f_z=0,2$ mm/tooth
$a_p=1$ mm, $a_e$ 2 mm

TABLE 3

| Variant | Tool life Edge 1 (min) | Tool life Edge 2 (min) |
|---|---|---|
| A | 5.2 | 4.5 |
| C | 4.3 | 5.4 |
| E | 2.5 | 2.8 |
| TiN | 3.1 | 2.5 |

In this test the variants with high amount of h-(Nb,Zr)N, as variant A (single phase h-NbN) and C, have the longest tool life.

The invention claimed is:

1. Cutting tool insert, solid end mill, or drill, comprising a substrate and a coating composed of one or more layers of refractory compounds of wherein at least one layer comprises crystalline hexagonal phase, h-(Me1,Me2)X, described with the composition $Me1_aMe2_{1-a}X_b$ where Me1 is Nb, and Me2 is Zr, and a>0.5 and X is N the ratio R=(at-% X)/(at-% Me1+at-% Me2) of the $Me1_aMe2_{1-a}X_b$ phase is between 0.5 and 1.0, and that X contains less than 30 at-% of O+B, the X-ray diffraction (XRD) pattern in at least one of θ-2θ or gracing incidence geometry from the crystalline hexagonal phase, h-(Me1,Me2)X, showing one or several of the following peaks:
   a h-(Me1,Me2)X (100) peak
   a h-(Me1,Me2)X (101) peak
   a h-(Me1,Me2)X (102) peak
   a h-(Me1,Me2)X (110) peak
   a h-(Me1,Me2)X (103) peak
   a h-(Me1,Me2)X (112) peak
   a h-(Me1,Me2)X (201) peak
   a h-(Me1,Me2)X (202) peak.

2. Cutting tool according to claim 1 wherein the ratio, L, between the area of the h-(Me1,Me2)X(110) plus (103) peaks (=A(h-(Me1,Me2)X $_{110+103}$) and the c-(Me1,Me2)X (200) peak (=A(c-(Me1,Me2)X $_{200}$), i.e. L=A ($h$-Me1Me2X$_{110+103}$)/A($c$-MeX$_{200}$) in the X-ray diffraction pattern, in θ-2θ geometry, from said layer, is larger than 0.1.

3. Cutting tool insert according to claim 1 wherein the texture herein defined as the ratio, K, between the area of the $h$-(Me1,Me2)X (100) peak and the $h$-(Me1,Me2)X (110) plus (103) peaks in the X-ray diffraction pattern, in θ-2θ geometry, from said layer is between 0 and 0.5.

4. Cutting tool insert according to claim 1 wherein the FWHM (Full Width Half Maximum) value of the $h$-(Me1,Me2)X (110) plus (103) peak in the X-ray diffraction pattern, in θ-2θ geometry, from said coating is between 0.5 and 3.0° 2θ.

5. Cutting tool insert according to claim 1 wherein the structure of the $h$-(Me1,Me2)X is of anti-NiAs type.

6. Cutting tool insert according to claim 1, wherein the ratio R=(at-% X)/(at-% Me1+at-% Me2) of the Me1$_a$Me2$_{1-a}$X$_b$ phase is between 0.75 and 1.0.

7. Cutting tool according to claim 1 wherein the ratio, L, between the area of the $h$-(Me1,Me2)X(110) plus (103) peaks (=A($h$-(Me1,Me2)X $_{110+103}$) and the $c$-(Me1,Me2)X (200) peak (=A($c$-(Me1,Me2)X $_{200}$), i.e. L=A ($h$-Me1Me2X,$_{110+103}$)/A($c$-MeX$_{200}$) in the X-ray diffraction pattern, in θ-2θ geometry, from said layer, is larger than 0.2.

8. Cutting tool according to claim 1 wherein the ratio, L, between the area of the $h$-(Me1,Me2)X(110) plus (103) peaks (=A($h$-(Me1,Me2)X $_{110+103}$) and the $c$-(Me1,Me2)X (200) peak (=A($c$-(Me1,Me2)X $_{200}$), i.e. L=A ($h$-Me1Me2X,$_{110+103}$)/A($c$-MeX$_{200}$) in the X-ray diffraction pattern, in θ-2θ geometry, from said layer, is larger than 0.1, and the peak-to-background ratio for the $h$-(Me1,Me2)X (110) plus (103) peaks is larger than 2.

9. Cutting tool according to claim 1 wherein the ratio, L, between the area of the $h$-(Me1,Me2)X(110) plus (103) peaks (=A($h$-(Me1,Me2)X $_{110+103}$) and the $c$-(Me1,Me2)X (200) peak (=A($c$-(Me1,Me2)X $_{200}$), i.e. L=A ($h$-Me1Me2X,$_{110+103}$)/A($c$-MeX$_{200}$) in the X-ray diffraction pattern, in θ-2θ geometry, from said layer, is larger than 0.1, and the peak-to-background ratio for the $h$-(Me1,Me2)X (110) plus (103) peaks is larger than 4.

10. Cutting tool according to claim 1 wherein the peak-to-background ratio for the $h$-(Me1,Me2)X (110) plus (103) peaks is larger than 2.

11. Cutting tool according to claim 1 wherein the peak-to-background ratio for the $h$-(Me1,Me2)X (110) plus (103) peaks is larger than 4.

12. Cutting tool insert according to claim 1 wherein the ratio, L, between the area of the $h$-(Me1,Me2)X (110) plus (103) peaks (=A($h$-(Me1,Me2)X $_{110+103}$) and the $c$-(Me1,Me2)X (200) peak (=A($c$-(Me1,Me2)X $_{200}$), i.e. L=A ($h$-Me1Me2X,$_{110+103}$)/A($c$-MeX$_{200}$) in the X-ray diffraction pattern, in θ-2θ geometry, from said layer, is larger than 0.2, and the peak-to-background ratio for the $h$-(Me1,Me2)X (110) plus (103) peaks is larger than 2.

13. Cutting tool according to claim 1 wherein the ratio, L, between the area of the $h$-(Me1,Me2)X(110) plus (103) peaks (=A($h$-(Me1,Me2)X $_{110+103}$) and the $c$-(Me1,Me2)X (200) peak (=A($c$-(Me1,Me2)X $_{200}$), ie. L=A ($h$-Me1Me2X,$_{110+103}$)/A($c$-MeX$_{200}$) in the X-ray diffraction pattern, in θ-2θ geometry, from said layer, is larger than 0.2, and the peak-to-background ratio for the $h$-(ME1,Me2)X (110) plus (103) peaks is larger than 4.

14. Cutting tool insert according to claim 1 wherein the FWHM (Full Width Half Maximum) value of the $h$-(Me1,Me2)X (110) plus (103) peak in the X-ray diffraction pattern, in θ-2θ geometry, from said coating is between 0.5 and 3.0° 2θ and the $h$-(Me1,Me2)X (100) peak is between 0.4 and 2.5° 2θ.

15. Cutting tool insert according to claim 1 wherein the FWHM (Full Width Half Maximum) value of the $h$-(Me1,Me2)X (100) peak is between 0.4 and 2.5° 2θ.

* * * * *